United States Patent [19]

Pfizenmaier et al.

[11] Patent Number: 5,032,886
[45] Date of Patent: Jul. 16, 1991

[54] HIGH-FREQUENCY POWER TRANSISTOR

[75] Inventors: Heinz Pfizenmaier, Leonberg; Gerhard Conzelmann, Leinfelden-Echterdingen, both of Fed. Rep. of Germany

[73] Assignee: Robert Bosch GmbH, Stuttgart, Fed. Rep. of Germany

[21] Appl. No.: 335,785

[22] PCT Filed: Sep. 2, 1987

[86] PCT No.: PCT/DE87/00397
§ 371 Date: Mar. 27, 1989
§ 102(e) Date: Mar. 27, 1989

[87] PCT Pub. No.: WO88/02554
PCT Pub. Date: Apr. 7, 1988

[30] Foreign Application Priority Data

Sep. 27, 1986 [DE] Fed. Rep. of Germany ....... 3632943

[51] Int. Cl.$^5$ .............................................. H01L 29/72
[52] U.S. Cl. .................................... 357/34; 357/14; 357/49; 357/53; 357/81
[58] Field of Search .................. 357/34, 53, 14, 81, 357/49

[56] References Cited

U.S. PATENT DOCUMENTS

| | | | |
|---|---|---|---|
| 3,896,475 | 7/1975 | Bonis | 357/34 |
| 4,106,048 | 8/1978 | Khajezadeh | 357/34 |
| 4,377,029 | 3/1983 | Ozawa | 357/34 |
| 4,651,192 | 3/1987 | Matsushita et al. | 357/81 |

FOREIGN PATENT DOCUMENTS

A0132614 2/1985 European Pat. Off. .
2051475 1/1981 United Kingdom ............... 357/34

OTHER PUBLICATIONS

Electric Design News, vol. 26, No. 15, 5 Aug. 1981, (Boston, MA, U.S.), "High-Voltage bipolar Darlington provides true Dielectric isolation".

Primary Examiner—Rolf Hille
Assistant Examiner—Steven Loke
Attorney, Agent, or Firm—Michael J. Striker

[57] ABSTRACT

A high-frequency power transistor is suggested in which the emitter and base contacts, as well as the collector contacts, occur in a principle plane on the silicon layer. A metallization can be arranged on the oppositely located second principle plane, which enables a connection with the heat sink in an easy manner. Shield grids can be provided within the substrate in order to compensate for the effect of unwanted depletion-layer diodes to a great extent.

14 Claims, 2 Drawing Sheets

HIGH-FREQUENCY POWER TRANSISTOR

PRIOR ART

The invention is directed to a high-frequency power transistor using bipolar epitaxy technique and having a plurality of emitters with emitter and base contact strips arranged in its base region, the emitter and base contacts are located at a main surface of the silicon layer.

High-frequency transistors for power output stages in high-frequency amplifiers are usually produced with the epitaxy technique. In known constructions, they are usually insulated against the heat sinks, which are conventionally connected to ground, with thin beryllium oxide layers because of the good heat conductivity. However, this isolation technique is not only expensive, but is also critical with respect to handling, since beryllium oxide is poisonous.

In addition, it is known to construct transistors in monolithic integration technology, wherein the individual components of such a semiconductor arrangement are isolated relative to one another and to the substrate by means of depletion or barrier layers, possibly also dielectric layers of SiO.

However, the losses of the depletion layer insulation increase as the operating frequency increases, since the depletion layer capacitances which are formed are loaded with ohmic bulk resistors. For this reason, the previously known monolithically integrated transistors are unsuitable in practice as high-frequency power transistors.

ADVANTAGES OF THE INVENTION

In contrast, the high-frequency power transistor of the invention has the advantage that an isolating intermediate layer which is applied during the wafer production process, can comprise a depletion or barrier layer, but preferably comprises a dielectric such as an oxide or a nitride layer, and is accordingly inexpensive and easy to use. An alloyable or solderable coating can be applied to this layer, which enables a connection with a heat sink. This is made possible in that the emitter, base and collector electrodes lie on the other main surface of the silicon layer, wherein the base region and the emitter contact strips are arranged between collector contact strips. This measure enables a simple, inexpensive production of a high-frequency power transistor, wherein the oxide or nitride layers can be deposited on the silicon as an intermediate layer using the plasma method during the wafer production process. A polysilicon layer can be applied additionally to the intermediate layer as alloyable coating. An aluminum nickel layer can serve as solderable coating, wherein a gold layer can be applied additionally as surface protection.

The heat sink connected with the transistor can be connected to ground relative to high frequency, but preferably also relative to direct current.

In order to prevent reflected capacitances, it is advantageous to arrange a highly doped shield grid in the silicon under the base connection lines and under the base contact spot, respectively, which shield grid is connected to ground potential at least relative to high frequency.

In order to create permanent defined conditions at the circumference of the semiconductor layer, it is also advantageous to provide an isolating diffusion region having the same doping as the substrate at least at the locations not connected to ground. The correspondingly constructed regions are accordingly passivated.

In order to stabilize the current distribution, resistors can be diffused into the feed lines to the individual emitter fingers, wherein these resistors can be formed by means of highly doped n-regions.

DRAWING

The invention is explained in more detail in the following description and with the aid of the drawing, in which.

DESCRIPTION OF THE PREFERRED EMBODIMENTS

Figure 1:
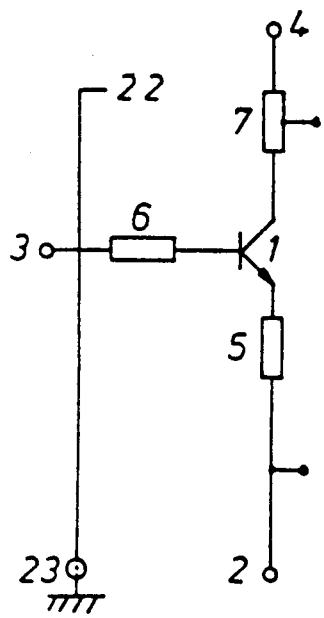
FIG. 1 shows the equivalent circuit diagram of a known bipolar monolithically integrated high-frequency transistor.

FIG. 1 shows an equivalent circuit of a high-frequency transistor 1 with emitter contact 2, base contact 3 and collector contact 4. The bulk resistors 5, 6 and 7 are indicated in the connection lines. The emitter bulk resistor 5 is increased at least by means of additional stabilization resistors which are assigned to every partial emitter. However, in the present equivalent wiring diagram, the illustration of such additional components and of inductances and parasitic capacitances is omitted.

If the high-frequency transistor 1 is constructed with monolithic integration technique, the depletion layer capacitance 9 of the substrate diode 10, with its loss producing series resistor 8, appears in addition.

Figure 2:
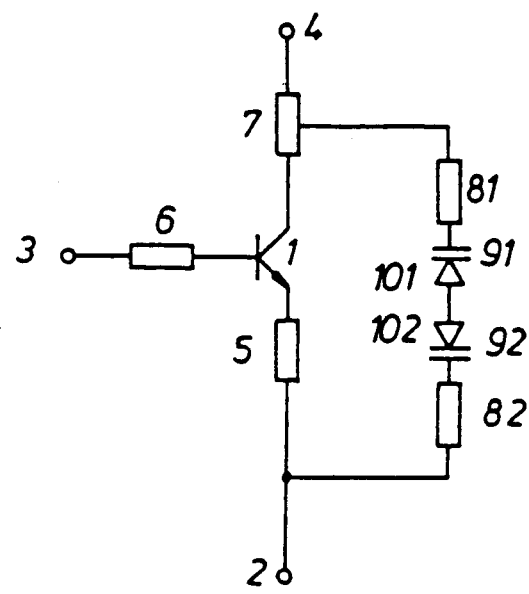
FIG. 2 shows the equivalent circuit of a monolithically integrated high-frequency transistor with an additional substrate diode according to the invention.

The depletion layer capacitance 9 of the substrate diode 10 and the losses in the series resistor 8 can now be reduced by means of a structure diverging from the usual structures of monolithically integrated circuits. This principle is shown in FIG. 2. A diode which is connected in series with the originally present substrate diode with opposite polarity is produced, in addition. In the equivalent circuit according to FIG. 2 the original substrate diode 10 is indicated as the substrate diode 101 with its depletion layer capacitance 91 and its series loss resistor 81. The series resistor 81 and capacitance 91 of the substrate diode 101 have remained approximately equal in magnitude as in the original substrate diode 10 by means of this change. The additional diode 102 connected in series with the diode 101 comprises the depletion layer capacitance 92 and the series resistor 82. It is made up of different partial diodes. The point in question is that its capacitance 92 be kept small relative to the substrate capacitance 91. The smaller the capacitance 92, the lower the losses in the substrate, but the more the substrate potential also corresponds to the collector potential relative to high frequency. The diode 102 is produced in that the highly doped p-type regions 14 (FIG. 5) which proceed from the upper main surface of a silicon layer, extend into the silicon and are connected to ground potential, are replaced by the n-doped regions 13, 15, 17 (FIG. 6).

Figure 3:
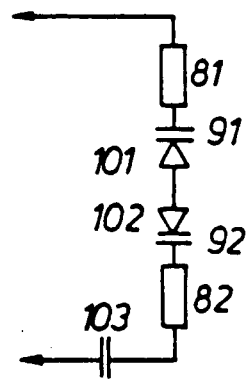
FIG. 3 shows the equivalent circuit of a monolithically integrated high-frequency transistor with shield grid and corresponding oxide capacitance.

If a shield grid which is insulated by means of oxide and connected to ground is located over the epitaxy, the equivalent wiring diagram shown in FIG. 3 is valid. The oxide capacitance 103, whose loss resistance relative to the resistors 81, 82 is negligible, is connected in series with the series connection of the substrate diode 101 and the diode 102. The same applies in an analogous manner to the lower main surface between substrate and heat sink.

In the frequency range from approximately 500 MHz to 1000 MHz, the different embodiment forms act chiefly by means of the series connection of the additional capacitances 92 or 92 and 103, respectively.

Figure 4:
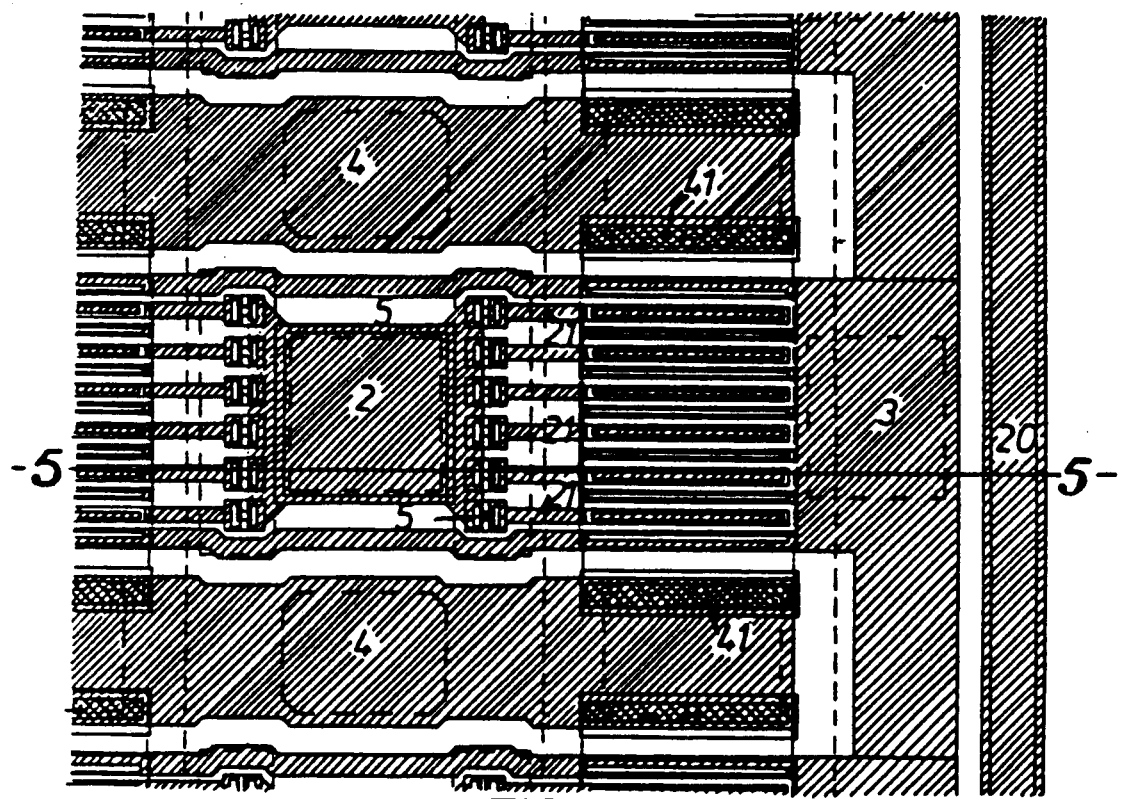
FIG. 4 shows a top view of a monolithically integrated high-frequency transistor.
Figure 5:
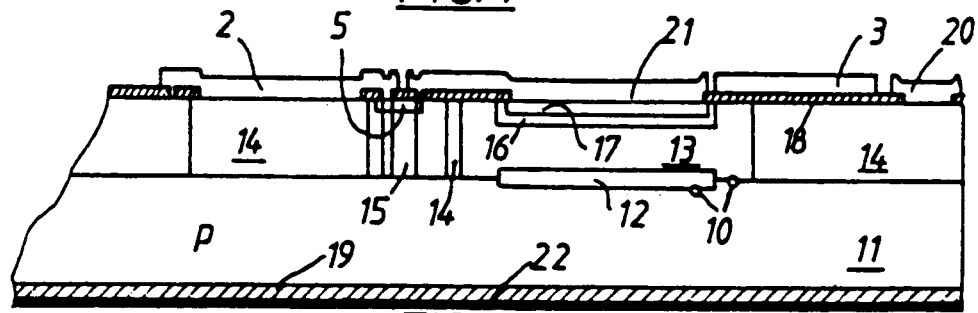
FIG. 5 shows a side view the section AB of the arrangement shown in FIG. 4.
Figure 6:
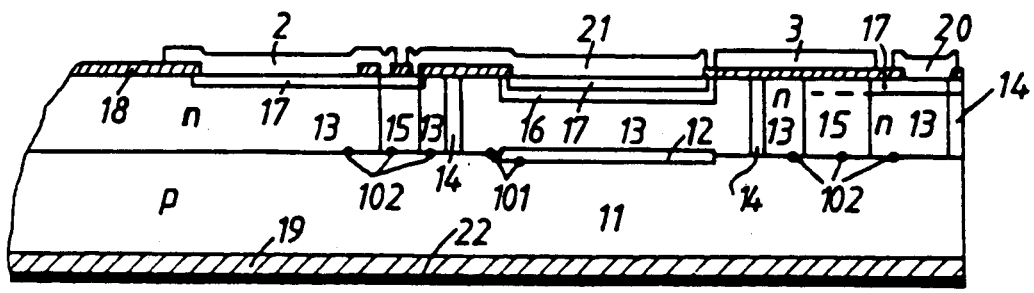
FIG. 6 shows a section AB of the arrangement shown in FIG. 4, but with a diffused-in deep collector, instead of the isolating diffusion, as a shield grid.

FIG. 4 shows a top view of a portion of a high-frequency transistor, of the invention, and FIGS. 5 and 6 show respectively the side section along section line AB.

As already mentioned, the contacts of emitter, base and collector are designated by reference numbers 2, 3, 4. Resistors 5 are introduced in the feed lines to the partial emitters as stabilization resistors, wherein connecting lines 21 extend from the resistors 5 to the emitters. Moreover, a metallic shield 20 is provided at the edge.

The p-doped substrate 11, the buried collector layer 12, the n-doped epitaxy 13 which is deposited on the latter, the diffused in insulation 14, the diffused in deep collector contact region 15, the base region 16 and the emitter region 17 can be seen in the sectional drawing (FIG. 5 and FIG. 6).

The p-n junctions occurring at the upper main surface are covered with the oxide layer 18 shown in this drawing with uniform thickness. The metallic contacts and connections, respectively, such as the emitter contact 2, connecting lines 21, base contact 3 and shield 20 are arranged on this oxide layer. Contacts to the diffusion regions located under the oxide layer are provided in corresponding oxide windows. Connection between the collector contacts 4 and the collector contact diffusion region (15) is established through windows 41 by means of metallizations indicated by hatched lines in FIG. 4. Similar metallizations serve as connection lines 21 for emitter contacts 2 and for base contacts 3. A metallization 22 on an isolating layer 19, which can be constructed as a dielectric layer or depletion layer, is located on the lower main surface of the substrate 11.

The substrate diode 10 of FIG. 1 is formed by the boundary layer of the collector space 12, 13 relative to the substrate 11. The capacitive back effect of the collector on the base contact 3 is drastically reduced by the open low-impedance diffusion 14 which is connected to ground via the connection line 20. The emitter resistors 5 can be produced with the emitter diffusion 17, the deep collector 15 and possibly also the buried layer 12 so as to be connected in parallel with the latter.

FIG. 6 shows a modification of the arrangement shown in FIG. 5. The large-area regions 14 of FIG. 5, which are connected with the grounded connections 2 and shield 20 and form an isolating diffusion, are omitted in the construction according to FIG. 6 and are substituted by the oppositely doped epitaxy 13 and the deep collector 15 with emitter 17, which is located partially above the latter. The substrate diode 10 has become the substantially similar substrate diode 101.

There are now n-doped regions located between the metallic regions 2, 20 and the substrate 11, so that the additional diode 102 is formed. The latter is connected in series with the substrate diode 101 with opposite polarity so that the capacitive displacement current, and accordingly also the losses in the ohmic bulk regions, is smaller. A depletion layer formed between the metallization 22 connected with metal or with a heat sink, respectively, and the substrate 11 is likewise effective. This can be applied to the lower principle plane of the substrate 11 as a dielectric layer 19.

We claim:

1. Monolithically integrated high-frequency power transistor, comprising a silicon layer which includes a high-impedance substrate of one type of conductivity and a high-impedance epitaxial layer of an opposite type of conductivity; an outer surface of said epitaxial layer forming a first main surface and an opposite outer surface of said substrate forming a second main surface of said silicon layer; a metallization arranged on said second main surface; said epitaxial layer being divided by means of isolating diffusion regions of said one type of conductivity into a plurality of areas which are at least partially electrically insulated one from each other; a plurality of interconnected partial transistors constructed in a strip-shaped manner and each having, proceeding from said first main surface, a base region diffused into one of said areas of the epitaxial layer, an emitter region diffused into said base region, a collector formed by means of the remaining portion of said one area and by means of a low-impedance collector region lying below the epitaxial layer in said one area and being partially embedded in said substrate, said collector region having said opposite type of conductivity whereby a first diode is formed between the substrate and the collector region; each of said partial transistors including an emitter contact, a base contact and a collector contact; said contacts lying at said first main surface; said collector contact being connected with said collector region by means of at least one low impedance collector contact diffusion region provided in a part of the epitaxial layer outside said isolating diffusion regions and extending from said first main surface through the entire thickness of the epitaxial layer to said substrate; said emitter region consisting of a plurality of emitter fingers arranged in said base region; a first group of connection lines extending at said first main surface between said collector contact and a collector contact of a neighboring partial transistor, a second group of connection lines connecting said emitter fingers with said emitter contact, and a third group of connection lines connecting said base region with said base contact; at least one shield grid region formed by other part of the epitaxial layer outside said isolating diffusion regions, said shield grid region including other low-impedance collector contact diffusion regions and extending from said first main surface through the entire thickness of the epitaxial layer to said substrate; grounding additional metallizations arranged at said first main surface above said shield grid region whereby additional diodes of opposite polarity than that of said first diode, are formed at the interface of said shield grid region with the substrate; and said additional diodes being connected in series with said first diode in order to reduce capacitive loads.

2. Transistor according to claim 1, wherein a heat sink is arranged at said second main surface.

3. Transistor according to claim 1, wherein p-n junctions of said epitaxial layer and said isolating diffusion regions on said first surface are covered with an insulating oxide layer, and said base contact being arranged on said oxide layer.

4. Transistor according to claim 1, wherein said substrate is electrically insulated by at least one isolating intermediate layer provided between said second main surface and said metallization.

5. Transistor according to claim 1, wherein the isolating intermediate layer is an nitride layer.

6. Transistor according to claim 4, wherein a solderable coating is applied between the substrate and the isolating intermediate layer.

7. Transistor according to claim 6, wherein an aluminum nickel layer serves as a solderable coating.

8. Transistor according to claim 4, wherein a depletion layer serves as said isolating intermediate layer.

9. Transistor according to claim 4, wherein the isolating intermediate layer is an oxide layer.

10. Transistor according to claim 4, wherein the isolating intermediate layer is formed by a depletion layer and a dielectric layer.

11. Transistor according to claim 4, wherein an alloyable coating is applied between the substrate and the isolating intermediate layer.

12. Transistor according to claim 11, wherein polysilicon is used as alloyable coating.

13. Transistor according to claim 1, wherein said isolating diffusion regions of the substrate conduction type surrounds at least partially the epitaxial layer.

14. Transistor according to claim 1, wherein the metallization, which is applied to the second main surface of the silicon layer, is connected to ground with respect to high frequency.

* * * * *